(12) United States Patent
Kong et al.

(10) Patent No.: US 9,048,613 B2
(45) Date of Patent: Jun. 2, 2015

(54) HYBRID VERTICAL CAVITY LASER AND METHOD OF MANUFACTURING THE SAME

(71) Applicant: Samsung Electronics Co., Ltd., Suwon-Si, Gyeonggi-Do (KR)

(72) Inventors: Duanhua Kong, Hwaseong-si (KR); Taek Kim, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 19 days.

(21) Appl. No.: 13/975,499

(22) Filed: Aug. 26, 2013

(65) Prior Publication Data
US 2014/0269803 A1 Sep. 18, 2014

(30) Foreign Application Priority Data
Mar. 18, 2013 (KR) .......................... 10-2013-0028820

(51) Int. Cl.
*H01S 5/022* (2006.01)
*H01S 5/18* (2006.01)
*H01S 5/183* (2006.01)
*H01S 5/026* (2006.01)
*H01S 5/10* (2006.01)

(52) U.S. Cl.
CPC ................ *H01S 5/026* (2013.01); *H01S 5/105* (2013.01); *H01S 5/18347* (2013.01); *H01S 5/18361* (2013.01)

(58) Field of Classification Search
CPC ............ H01S 5/22; H01S 5/026; H01S 5/18; H01S 5/183; H01S 5/18347
USPC ........................................ 372/50.124, 99, 102
See application file for complete search history.

(56) References Cited

U.S. PATENT DOCUMENTS

| | | | |
|---|---|---|---|
| 7,473,651 B2 | 1/2009 | Moriya et al. | |
| 7,845,023 B2 | 12/2010 | Swatee | |
| 7,935,989 B2 | 5/2011 | Matsumoto et al. | |
| 2002/0191659 A1 | 12/2002 | Skogman | |
| 2012/0225534 A1 | 9/2012 | Lee et al. | |
| 2012/0228098 A1 | 9/2012 | Pai et al. | |
| 2012/0231622 A1 | 9/2012 | Chen et al. | |

FOREIGN PATENT DOCUMENTS

| | | |
|---|---|---|
| JP | 2007173304 A | 7/2007 |
| JP | 4669213 B2 | 4/2011 |
| KR | 100795994 B1 | 1/2008 |
| KR | 20080057522 A | 6/2008 |
| KR | 20100121969 A | 11/2010 |

*Primary Examiner* — Armando Rodriguez
(74) *Attorney, Agent, or Firm* — Harness, Dickey & Pierce, P.L.C.

(57) ABSTRACT

A hybrid vertical cavity laser includes an optical circuit substrate including a grating having refractive index units having a lower refractive index and a higher refractive index with respect to each other that are alternately arranged in a first direction, and a waveguide guiding light in the first direction, a mesa structure on the optical circuit substrate, the mesa structure including a first-type semiconductor layer including an exposed portion, an active layer, a second-type semiconductor layer, and an upper reflective layer sequentially stacked in a second direction perpendicular to the first direction, a first electrode on the exposed portion, and a second electrode on the upper reflective layer. An overlapped length between the waveguide and a mesa aperture forming an opening through which light produced from the active layer enters the grating is D, a pitch of the grating is p, and 0<D<p.

9 Claims, 9 Drawing Sheets

HYBRID VERTICAL CAVITY LASER AND METHOD OF MANUFACTURING THE SAME

CROSS-REFERENCE TO RELATED APPLICATIONS

This application claims the benefit of Korean Patent Application No. 10-2013-0028820, filed on Mar. 18, 2013, in the Korean Intellectual Property Office, the disclosure of which is incorporated herein in its entirety by reference.

BACKGROUND

1. Field

Some example embodiments relate to a hybrid vertical cavity laser and/or a method of manufacturing the same.

2. Description of the Related Art

An optical interconnection technology for data communication by using light has less transmission loss and electromagnetic interference as compared to electrical interconnection. Thus, such an optical interconnection technology is suitable for implementing a system for high-bandwidth, higher speed data communication. Recently, interests in a technology to implement a silicon-based optical integrated circuit have increased.

The silicon-based optical integrated circuit may include several optical devices such as a light source, an optical waveguide, an optical modulator, an optical filter, a photodetector, etc. and carries a signal by optical interconnection. In this case, a technique to increase the optical efficiency of an integrated structure, for example, a structure or manufacturing method for enabling light emitted from the light source to be efficiently coupled is an important task.

For example, a hybrid vertical cavity laser has a structure in which a vertically resonating and oscillating laser beam is coupled to an optical waveguide for transmitting the laser beam along a horizontal direction, and in this case, structure in which a laser aperture is coupled to the optical wave guide is related closely to coupling efficiency. Furthermore, in case that a laser has a mesa structure with a higher aspect ratio, a manufacturing process for precise alignment between the laser aperture and the optical wave guide is somewhat complex.

SUMMARY

Some example embodiments provide a hybrid vertical cavity laser and/or a method of manufacturing the same.

Additional aspects will be set forth in part in the description which follows and, in part, will be apparent from the description, or may be learned by practice of example embodiments.

According to an example embodiment, a hybrid vertical cavity laser includes an optical circuit substrate including a grating having lower refractive index units and a higher refractive index unit alternately arranged in a first direction, the lower refractive index units having a lower refractive index than the higher refractive index unit, and a waveguide guiding light in the first direction, a mesa structure on the optical circuit substrate, the mesa structure including a first-type semiconductor layer, an active layer, a second-type semiconductor layer, and an upper reflective layer sequentially stacked in a second direction perpendicular to the first direction, the first-type semiconductor layer including an exposed portion, a first electrode on the exposed portion of the first-type semiconductor layer, and a second electrode on the upper reflective layer. An overlapped length between the waveguide and a mesa aperture forming an opening through which light produced from the active layer enters the grating is D, a pitch of the grating is p, and $0<D<p$.

The optical circuit substrate may include a first layer, a second layer on the first layer, the second layer including a material having a refractive index higher than that of the first layer and patterned to form the grating and the waveguide, and a dielectric material layer on the second layer, the dielectric material layer including a material having a refractive index lower than that of the second layer.

The first layer may be formed of silicon oxide, and the second layer may be formed of silicon. The optical circuit substrate may include a silicon on insulator (SOI) substrate, the SOI substrate including a first silicon layer, a silicon oxide layer, and a second silicon layer, the silicon oxide layer may be the first layer, and the second silicon layer may be patterned to form the second layer. The higher refractive index unit may include silicon, and the lower refractive index units may include air.

A width of lower refractive index units and an interval between neighboring lower refractive index units may be constant. The lower refractive index units may include a first lower refractive index unit and a second lower refractive index unit, the first lower refractive index unit and the second lower refractive index unit having different widths, the first lower refractive index unit and the second lower refractive index unit may be alternately arranged, and the pitch p of the grating is defined as ½ of a pitch between neighboring first lower refractive index units. An interval between neighboring first lower refractive index units and an interval between neighboring second lower refractive index units may be constant. An angle between a side of the mesa structure and the exposed portion of the first-type semiconductor layer may be less than 90°.

According to example embodiments, a method of manufacturing a hybrid vertical cavity laser includes forming an optical circuit substrate including a grating having a lower refractive index unit and a higher refractive index unit alternately arranged in a first direction, the lower refractive index unit having a lower refractive index than the higher refractive index unit, and a waveguide guiding light in the first direction, forming a laser structure on the optical circuit substrate, the forming a laser structure including stacking a first-type semiconductor layer, an active layer, a second-type semiconductor layer, and an upper reflective layer in order, forming a mesa structure by etching the laser structure in a mesa shape to expose a portion of the first-type semiconductor layer, and forming first and second electrodes on the mesa structure by a single metal deposition process, the first electrode on the exposed portion of the first-type semiconductor and the second electrode on the upper reflective layer.

The laser structure may be formed by forming a stacked structure on a semiconductor substrate including sequentially stacking the upper reflective layer, the second-type semiconductor layer, the active layer, the first-type semiconductor layer, and a dielectric material layer having a refractive index lower than that of the higher refractive index unit, bonding the stacked structure onto the optical circuit substrate so that the first-type semiconductor layer faces the optical circuit substrate, and removing the semiconductor substrate.

The upper reflective layer may have a distributed Bragg mirror structure. The mesa structure may be formed by patterning a mask layer on the upper reflective layer, and etching the laser structure using the patterned mask layer. An overlapped length between the mask layer and the waveguide may be D, the pitch of the grating may be p, and the patterning a mask layer may satisfy $0<D<p$.

The mesa structure may be formed by etching the laser structure so that an angle between a side of the mesa structure and the exposed portion of the first-type semiconductor layer is less than 90°.

The first and second electrodes may be formed by forming a photoresist layer entirely covering the mesa structure and the exposed portion of the first-type semiconductor layer, patterning the photoresist layer, depositing a metal material on the patterned photoresist layer, the mesa structure and the portion of the first-type semiconductor layer exposed by the patterning the photoresist layer, and removing the patterned photoresist layer by a lift-off process.

The photoresist layer may be patterned by performing a photolithography process to form a pattern corresponding to a shape of the first electrode, and removing a portion of the photoresist layer on an upper portion of the mesa structure using a plasma process.

The optical circuit substrate may be formed by forming a first layer, forming a second layer on the first layer, the second layer including a material having a refractive index higher than that of the first layer, and patterning the second layer to form the grating and the waveguide. The first layer may be a silicon oxide layer, and the second layer may be a silicon layer.

The optical circuit substrate may be formed by providing a silicon on insulator (SOI) substrate, the SOI substrate including a first silicon layer, a silicon oxide layer, and a second silicon layer, and patterning the second silicon layer to form the grating and the waveguide.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
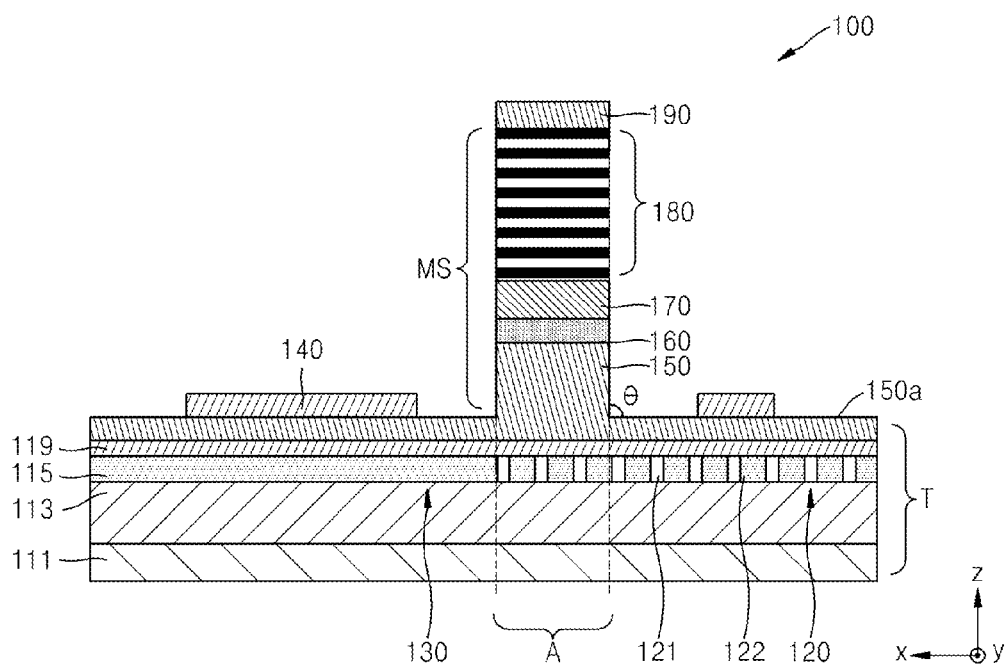
FIG. 1 is a sectional view of a schematic structure of a hybrid vertical cavity laser according to an example embodiment.

Example embodiments will be described in detail with reference to the accompanying drawings. In the drawings, like numeral references refer to like components and the dimension of each component may be exaggerated for clarity of description and for convenience.

It will be understood that, although the terms first, second, third etc. may be used herein to describe various elements, these elements should not be limited by these terms. These terms are used to distinguish one element from another. Thus, a first element discussed below could be termed a second element without departing from the teachings of example embodiments. As used herein, the term "and/or" includes any and all combinations of one or more of the associated listed items.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
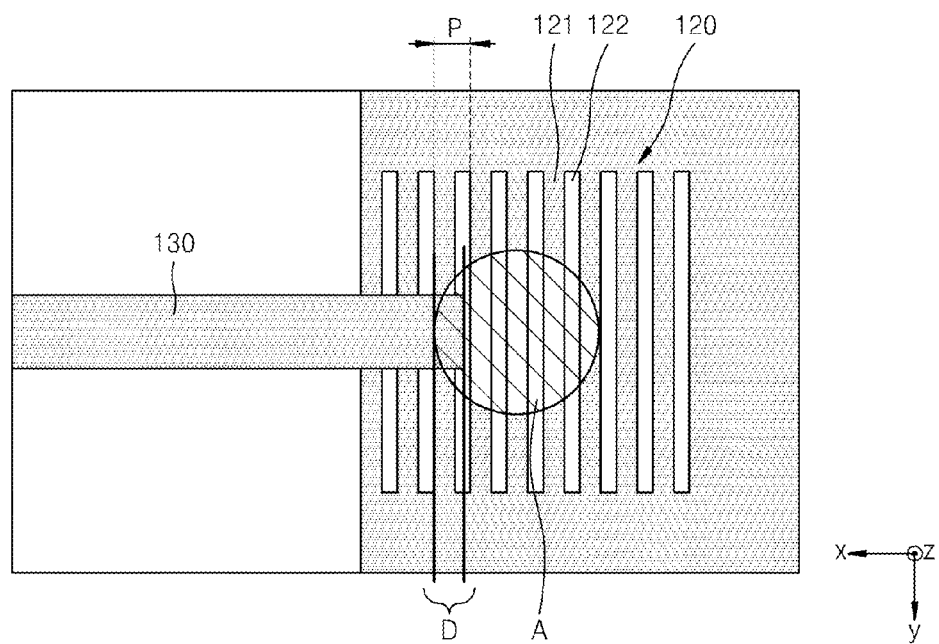
FIG. 2 is a plan view of overlapping between a mesa aperture and an optical waveguide in the hybrid vertical cavity laser of FIG. 1.
Figure 3:
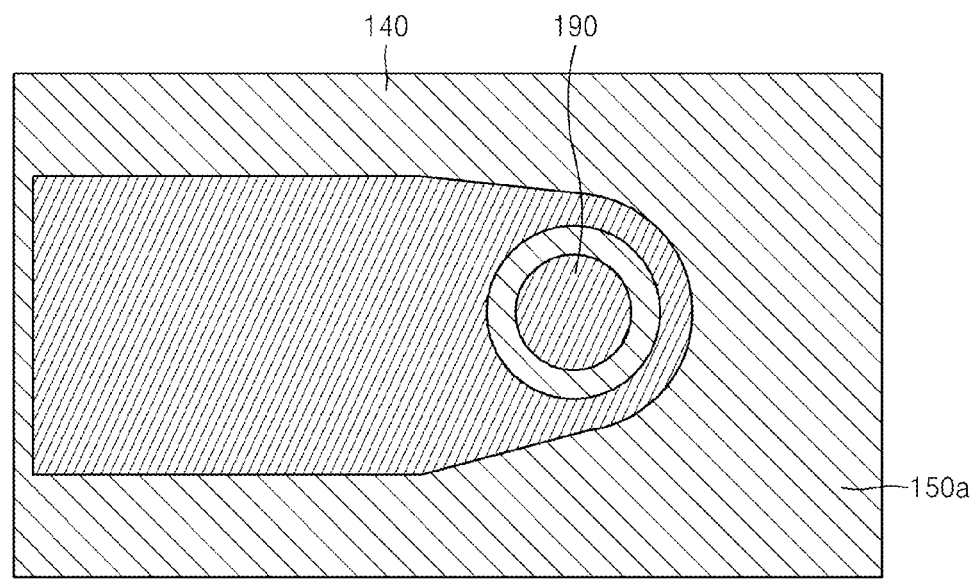
FIG. 3 is a plan view of an electrode structure of the hybrid vertical cavity laser of FIG. 1.

FIG. 1 is a sectional view of a schematic structure of a hybrid vertical cavity laser 100 according to an example embodiment, FIG. 2 is a plan view of overlapping between a mesa aperture A and an optical waveguide 130 in the hybrid vertical cavity laser 100 of FIG. 1, and FIG. 3 is a plan view of an electrode structure of the hybrid vertical cavity laser 100 of FIG. 1.

Referring to FIGS. 1 thorough 3, the hybrid vertical cavity laser 100 includes an optical circuit substrate T including a grating 120 wherein a lower refractive index unit 122 and a higher refractive index unit 121 are alternately arranged in a first direction (X direction), the lower refractive index unit 122 having a lower refractive index than the higher refractive index unit 121, and a waveguide 130 that guides light in the first direction; and a first-type semiconductor layer 150, an active layer 160, a second-type semiconductor layer 170, and an upper reflective layer 180 that are sequentially stacked on the optical circuit substrate T in a second direction (Z direction) perpendicular to the first direction. The first-type semiconductor layer 150, the active layer 160, the second-type semiconductor layer 170, and the upper reflective layer 180 make a mesa structure (MS) having a mesa-etched, protruded shape so that a portion of the first-type semiconductor layer 150 is exposed. A first electrode 140 is formed on the exposed mesa-etched surface 150a of the first-type semiconductor layer 150 and a second electrode 190 is formed on the upper reflective layer 180.

When it is considered that the overlapped length between the waveguide 130 and a mesa aperture A forming an opening through which light produced from the active layer 160 enters the grating 120 is D and the pitch of the grating 120 is p, the condition 0<D<p may be satisfied. Also, the condition 0.1 p<D<0.4 p may be satisfied. In this case, p of the grating 120 is an interval between neighboring lower refractive index units 122.

The above conditions are proposed to increase the efficiency of a laser beam produced from the active layer 160 and vertically resonating and oscillating between the grating 120 and the upper reflective layer 180 coupled to the waveguide 130. If the waveguide 130 does not overlap the mesa aperture A, the coupling efficiency is uniformly low, and if the waveguide 130 overlaps the mesa aperture A, the coupling efficiency increases to over 90% and higher coupling efficiency is maintained within a given range. Aligning the overlapped length between the waveguide 130 and the mesa aperture A is performed during the etching step of forming the mesa structure MS, and if the mesa structure MS has a great aspect ratio, difficulty in alignment increases. In the present embodiment, the overlapped length between the waveguide 130 and the mesa aperture A is properly set to reflect such matters, and in addition, an angle θ that a side of the mesa structure MS and the mesa-etched surface 150a of the first-type semiconductor layer 150 make is less than 90° to facilitate alignment of the waveguide 130 with the mesa structure MS. A related manufacturing method will be described below.

A structure of the hybrid vertical cavity laser 100 will be described in more detail.

The optical circuit substrate T includes a first layer 113, and a second layer 115 that is formed of a material having a refractive index higher than that of the first layer 113 and on which the shapes of the grating 120 and the waveguide 130 are patterned as shown in FIG. 2. In addition, a dielectric material layer 119 may be formed on the second layer 115. A material of the dielectric material layer 119 has a refractive index lower than that of the second layer 115.

The first layer 113 may be made of a silicon oxide and the second layer 115 may be made of silicon. In addition, the dielectric material layer 119 may be made of a silicon oxide or $ZrO_2$, $TiO_2$, MgO, $CeO_2$, $Al_2O_3$, $HfO_2$, NbO, $Si_3N_4$.

As shown, the optical circuit substrate T includes a silicon on insulator (SOI) substrate that has a structure including a silicon layer 111, the first layer 113 being an silicon oxide layer, and the second layer 115 being an silicon layer. As the second layer 115 is an upper silicon layer, it is possible to pattern the second layer 115 to form the grating 120 and the waveguide 130.

The grating 120 includes a plurality of higher refractive index units 121 and lower refractive index units 122 that are alternately arranged. The higher refractive index unit 121 may be a silicon layer and the lower refractive index unit 122 may be made of a material having a refractive index lower than that of silicon, e.g., the lower refractive index unit 122 may be an air layer. The lower refractive index unit 122 and the higher refractive index unit 121 may have a bar shape and may be arranged in parallel to each other in the first direction. The first direction may be the x direction in the figures. Such a grating 120 is referred to also as a high index contrast grating (HCG). The lower refractive index unit 122 and the higher refractive index unit 121 may be formed by patterning and etching the silicon layer 115 so that a region where a silicon material has been removed by etching may become the lower refractive index unit 122 and a region where the silicon material has not been removed may become the higher refractive index unit 121.

The widths of the lower refractive index units 122 and the intervals between neighboring lower refractive index units 122 are constant. However, example embodiments are not limited thereto and other examples will be described below.

The first-type semiconductor layer 150, the active layer 160, and the second-type semiconductor layer 170 are formed on the optical circuit substrate T, the first-type semiconductor layer 150 may be a N-type Group III-V semiconductor layer, and the second-type semiconductor layer 170 may be a P-type group III-V semiconductor layer. The Group III-V semiconductor layer may be formed of InP or GaAs.

The upper reflective layer 180 reflects light produced from the active layer 152 toward the grating 120 placed underneath to allow light to resonate between the upper reflective layer 180 and the grating 120. The upper reflective layer 180 may have a distributed Bragg reflector (DBR) structure that is designed to have a maximum reflectivity at a desired resonant wavelength λ. The upper reflective layer 180 may be formed in such a manner that two material layers with different refractive indexes are alternately stacked repetitively with a thickness of about ¼ of the desired resonant wavelength (i.e., λ/4). For example, the DBR structure may be formed in such a manner that a $Al_xGa_{(1-x)}As$ layer and a $Al_yGa_{(1-y)}As$ layer (where 0≤x, y≤1, x≠y) are alternately stacked repetitively with a thickness of about λ/4. Although it is described that the DBR structure is used for the upper reflective layer 180, example embodiments are not limited thereto and other reflective layer structures, e.g., grating 120, may be employed.

The first electrode 140 is formed on the mesa-etched surface 150a of the first-type semiconductor layer 150 and the second electrode 190 is formed on the upper reflective layer 180 to inject currents into the active layer 160. In addition, the upper reflective layer 180 may be doped with a predetermined dopant to facilitate injection of currents into the active layer 160.

When currents are injected through the first electrode 140 and the second electrode 190, electrons and holes are recombined at the active layer 150 and start oscillating laser light. The light emitted from the active layer 150 by recombination increases in intensity while reciprocating between the upper reflective layer 180 and the grating 120 and upon reaching a predetermined intensity, the light is emitted as laser light from the grating 120 with reflectivity lower than that of the upper reflective layer 180, and is coupled to the optical waveguide 130 and carried to other optical devices that are not shown.

Figure 4:
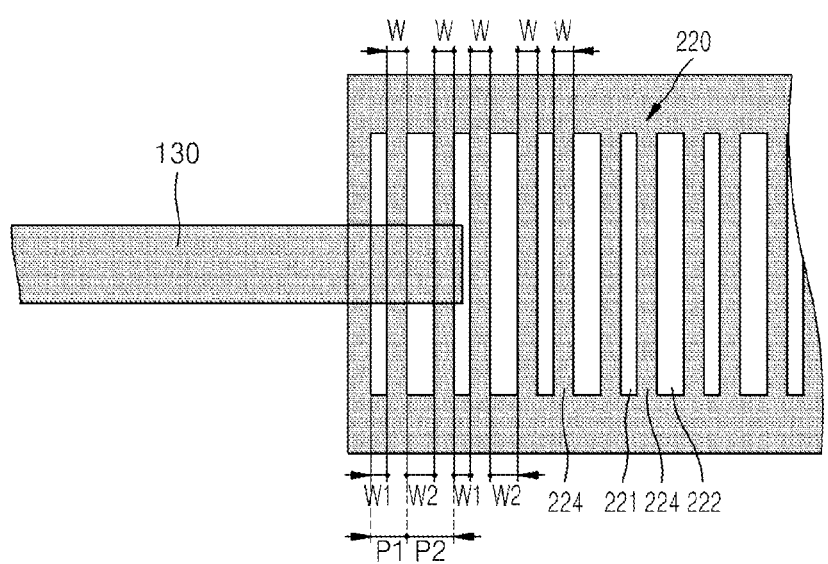
FIG. 4 is a plan view of an example structure of a grating that may be employed in the hybrid vertical cavity laser of FIG. 1.

FIG. 4 is a plan view of an example structure of the grating 220 that may be employed in the hybrid vertical cavity laser of FIG. 1.

The lower refractive index unit of the grating 220 includes a first lower refractive index unit 221 and a second lower refractive index unit 222 that have different widths, and a higher refractive index unit 224 may be arranged between the first lower refractive index unit 221 and the second lower refractive index unit 222. In this case, the pitches between neighboring lower refractive index units 221 are not constant and two pitches, p1 and p2 are obtained. In this case, the pitch of the grating that becomes reference of the overlapped length between the mesa aperture and the grating may be defined as an average of P1 and P2, i.e., ½ of the pitch P1+P2 between neighboring first lower refractive index units 221.

Figure 5:
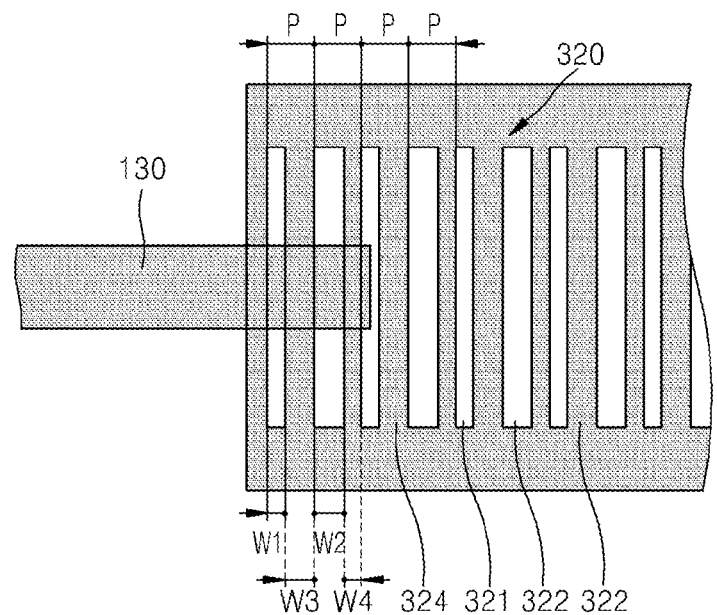
FIG. 5 is a plan view of another example structure of a grating that may be employed in the hybrid vertical cavity laser of FIG. 1.

FIG. 5 is a plan view of another example structure of the grating 320 that may be employed in the hybrid vertical cavity laser 100 of FIG. 1.

The grating 320 is formed in such a manner that a first lower refractive index unit 321 and a second lower refractive index unit 322 that have different widths of W1, W2 are alternately arranged. The intervals between a first lower refractive index unit 321 and a second lower refractive index unit 322 are not constant but have two value W3 and W4, so that a pitch between a first lower refractive index unit 321 and a second lower refractive index unit 322 becomes constant value P. That is, they are alternately arranged so that the intervals between the first lower refractive index unit 321 and the second lower refractive index unit 322 also have two values.

Figure 6:
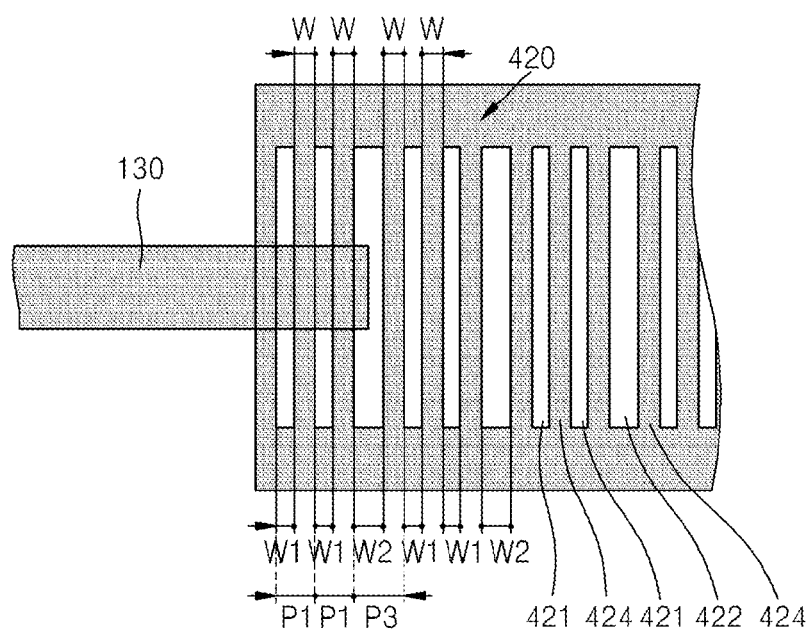
FIG. 6 is a plan view of another example structure of a grating that may be employed in the hybrid vertical cavity laser of FIG. 1.

FIG. 6 is a plan view of another example structure of the grating 420 that may be employed in the hybrid vertical cavity laser 100 of FIG. 1.

The grating 420 according to an example embodiment has a structure in which two first lower refractive index units 421 and one second lower refractive index unit 422 with a width different from that of the first lower refractive index units 421 are alternately arranged, the pitches between neighboring lower refractive index units are P1, P1, and P3 in order. In this case, the pitch of the grating that becomes reference of the overlapped length between the mesa aperture and the waveguide may be defined as an average of three values.

FIGS. 7A to 7M are views for explaining a method of manufacturing a hybrid vertical cavity laser according to an embodiment of the inventive concept.

The method of manufacturing the hybrid vertical cavity laser according to the embodiment roughly includes forming an optical circuit substrate, forming a laser structure on the optical circuit substrate, forming a mesa structure by mesa-etching the laser structure and then forming an electrode structure. When forming the electrode structure, a top electrode and an electrode on the mesa-etched surface are formed by performing a single metal deposition process.

More detailed example processes are described below with reference to the figures.

Figure 7A:
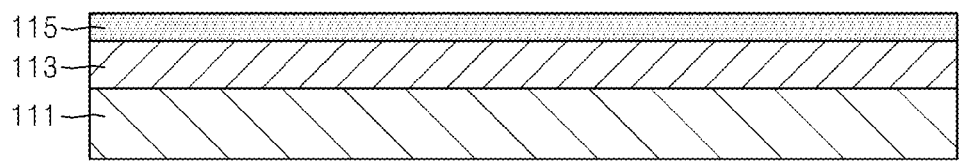
FIGS. 7A to 7M are views for explaining a method of manufacturing a hybrid vertical cavity laser according to an example embodiment.

Referring to FIG. 7A, a first layer 113 is formed, and a second layer 115 with a refractive index higher than that of the first layer 113 is formed on the first layer 113. The first layer 113 may be a silicon oxide layer and the second layer 115 may be a silicon layer. Alternatively, structure of FIG. 7A may be a SOI substrate which includes the silicon layer 111, the first layer 113 including silicon oxide, and the second layer 115 including silicon.

Figure 7B:
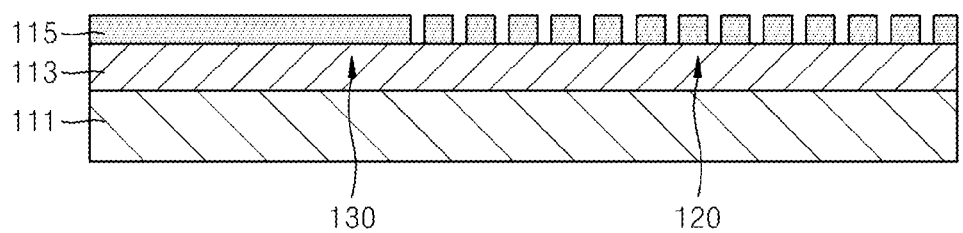

As shown in FIG. 7B, the second layer 115 is patterned to form the waveguide 130 and the grating 120 to form the optical circuit substrate. The grating 120 may have various shapes that are shown in FIG. 2 or FIGS. 4 to 6.

Figure 7C:
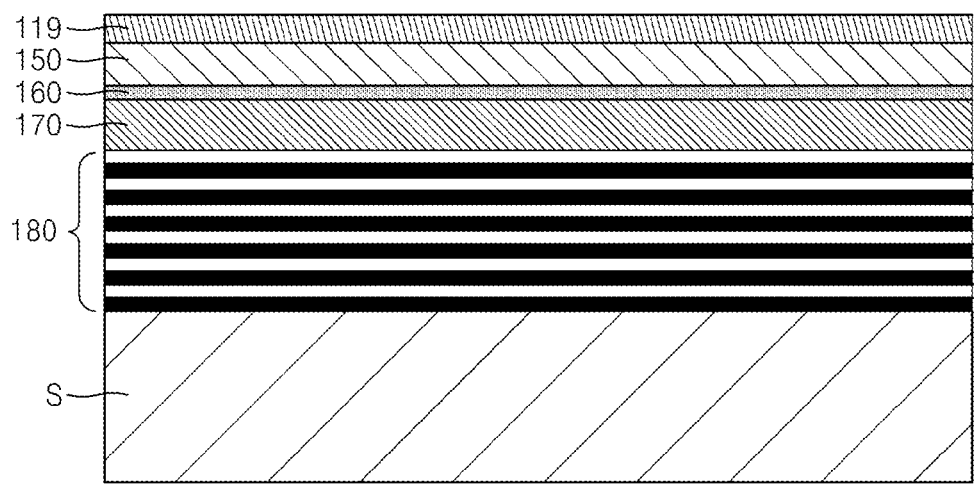

As shown in FIG. 7C, a laser structure which includes an upper reflective layer 180, a second-type semiconductor layer 170, an active layer 160, and a first-type semiconductor layer 150 is formed. Such a structure may be formed on a semiconductor substrate S. In addition, a dielectric material layer 119 having a refractive index lower than that of the second layer 115 of FIG. 7A is formed on the first-type semiconductor layer 150.

The upper reflective layer 180 may have a distributed Bragg mirror structure. The first-type semiconductor layer 150, the active layer 160, and the second-type semiconductor layer 170 may be made of a group semiconductor material. For example, the first-type semiconductor layer 150 may be an N-type group III-V semiconductor layer and the second-type semiconductor layer 170 may be a P-type semiconductor layer. InP, GaAs, etc. may be employed as the group III-V semiconductor material. The dielectric material layer 119 may be made of a silicon oxide or $ZrO_2$, $TiO_2$, MgO, $CeO_2$, $Al_2O_3$, $HfO_2$, NbO, or $Si_3N_4$.

Figure 7D:
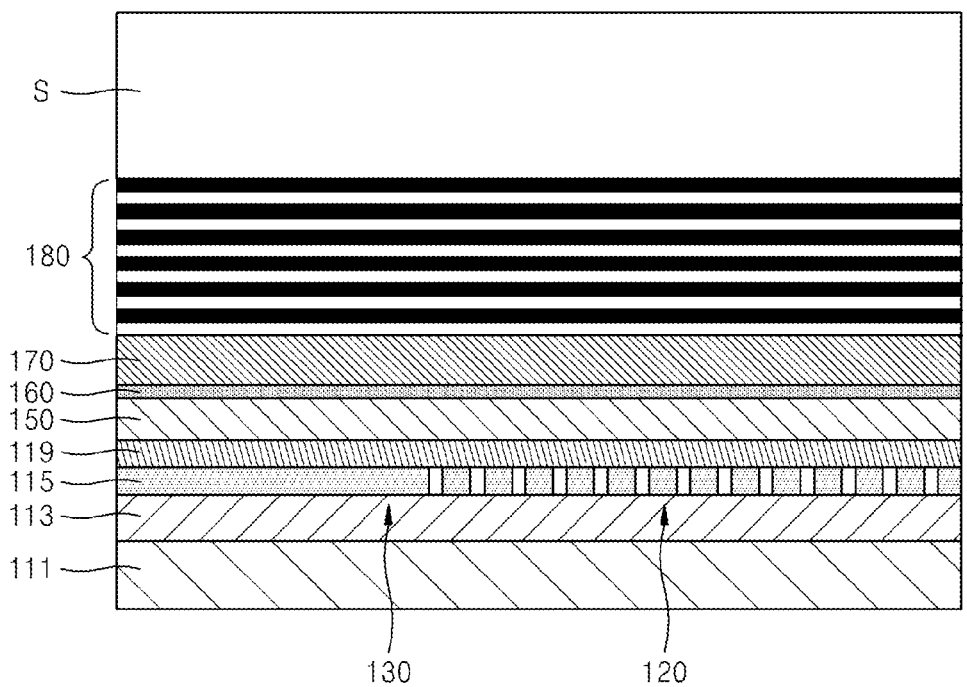

Referring to FIG. 7D, the structure of FIG. 7C is bonded onto the optical circuit substrate of FIG. 7B, and in this case, the first-type semiconductor layer 150 is bonded to face the second layer 115.

Figure 7E:
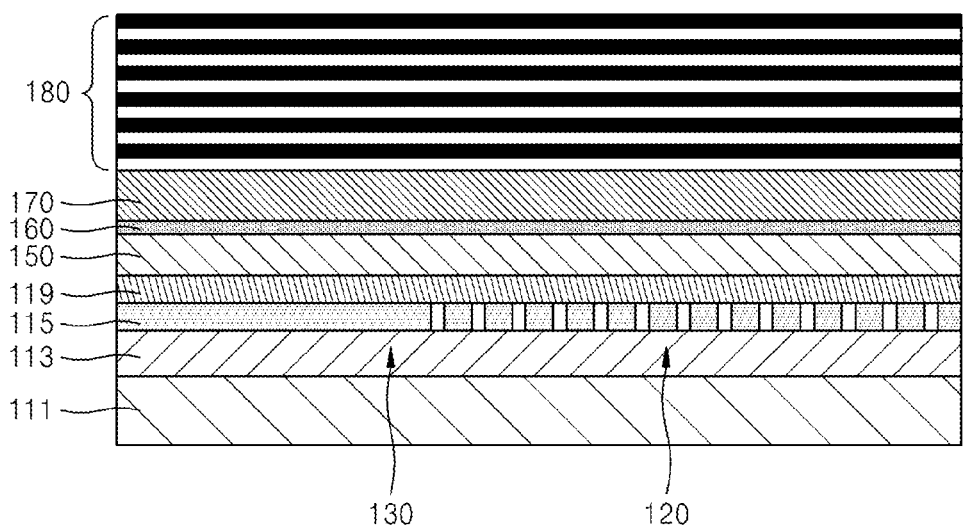
Figure 7F:
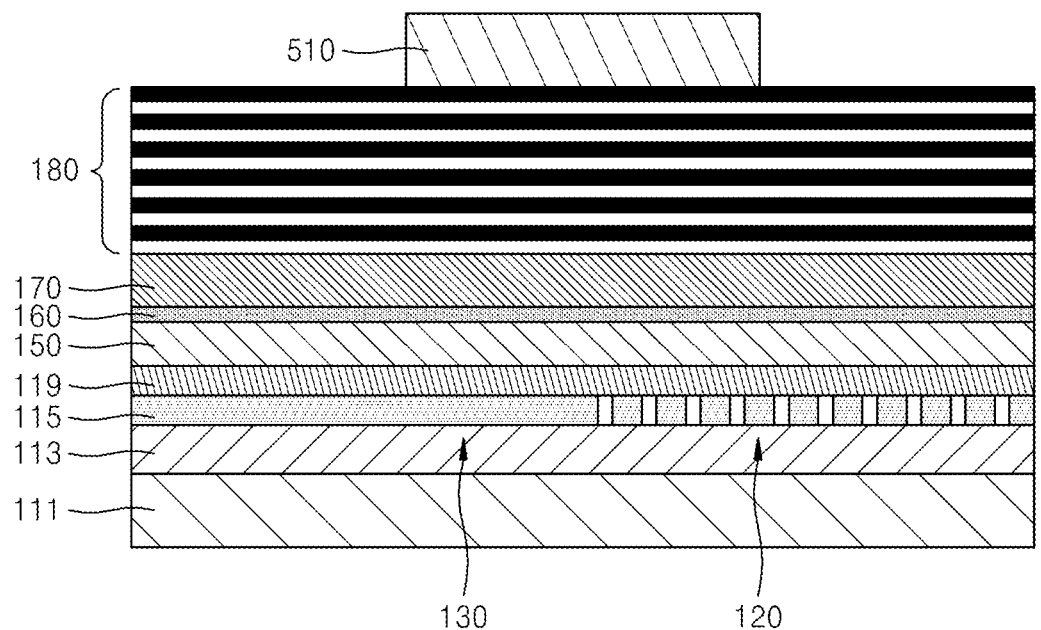

The semiconductor substrate S is removed as shown in FIG. 7E, and a mask layer 510 is formed on the upper reflective layer 180 as shown in FIG. 7F. The mask layer 510 may be made of a silicon oxide material and is patterned to have a shape which matches a size of a mesa aperture to be formed and alignment with the waveguide 130.

Figure 7G:
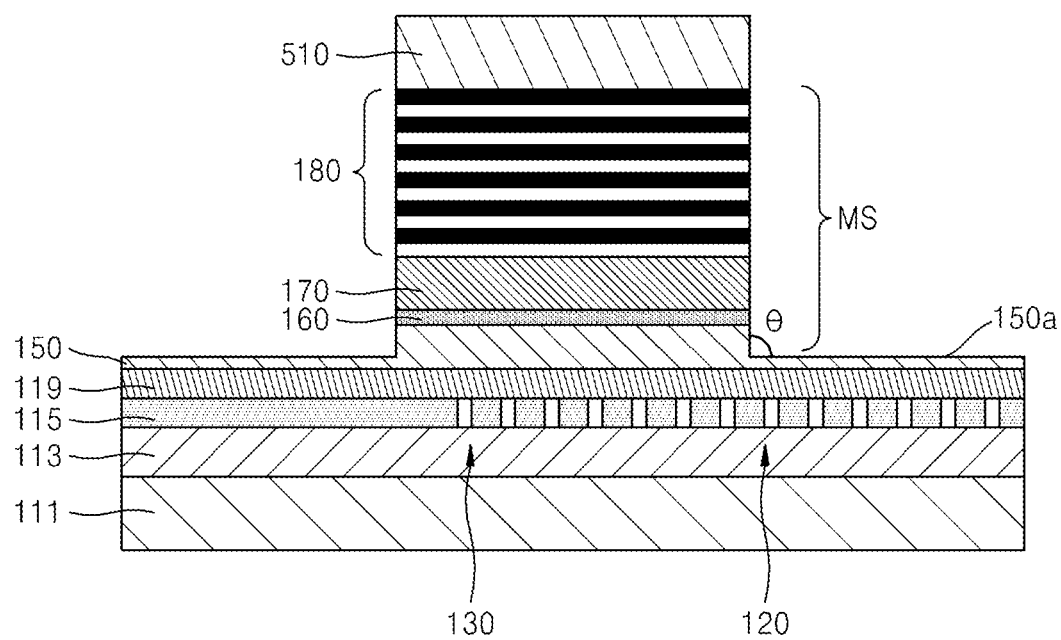
Figure 7H:
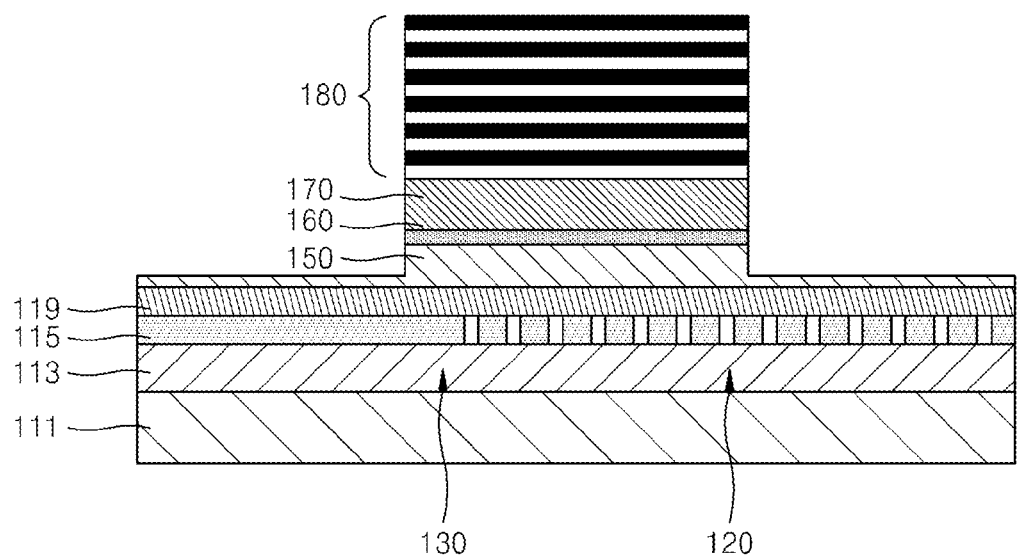

As shown in FIG. 7G, the mask layer 510 is used as an etch mask to mesa-etch the upper reflective layer 180, the second-type semiconductor layer 170, the active layer 160, and the first-type semiconductor layer 150 to form a mesa structure MS and a portion of the first-type semiconductor layer 150 is exposed. The exposed portion of the first-type semiconductor layer 150 is referred to as a mesa-etched surface 150a.

In this etch process, an angle between the mesa structure (MS) and the mesa-etched surface 150a make may be less than 90°. This condition is proposed so that a metal portion to be lifted off and a metal portion to become a second electrode on the top of the metal structure (MS) cannot be connected, at following metal deposition and lifting off steps.

Figure 7I:
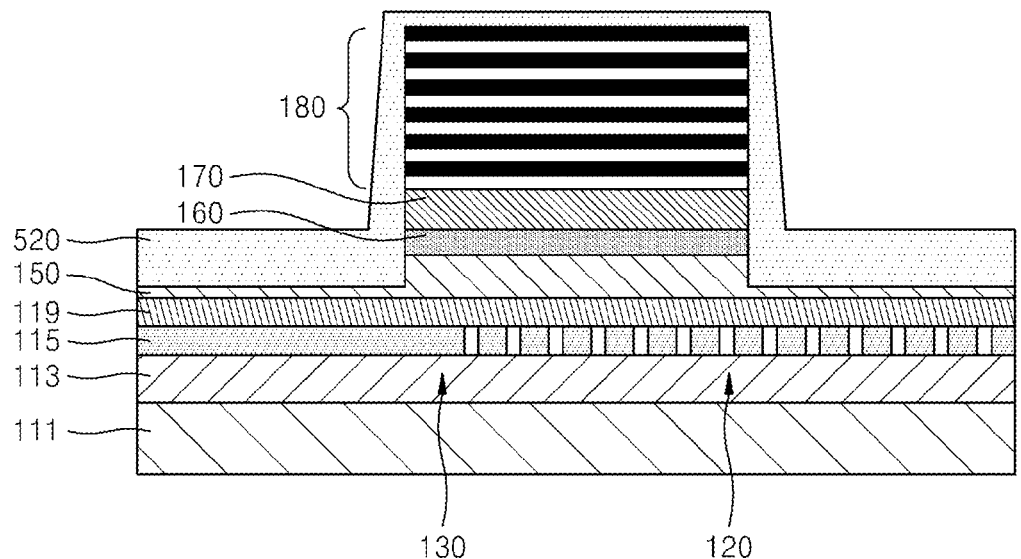

As shown in FIG. 7I, a photoresist layer 520 is formed all over the mesa structure (MS) and the mesa-etched surface 150a. A spin coating technique may be used and a thickness of the photoresist layer 520 on the top of the mesa structure (MS) is thinner than that of the photoresist layer 520 on the mesa-etched surface 150a owing to a higher aspect ratio of the mesa structure (MS).

Figure 7J:
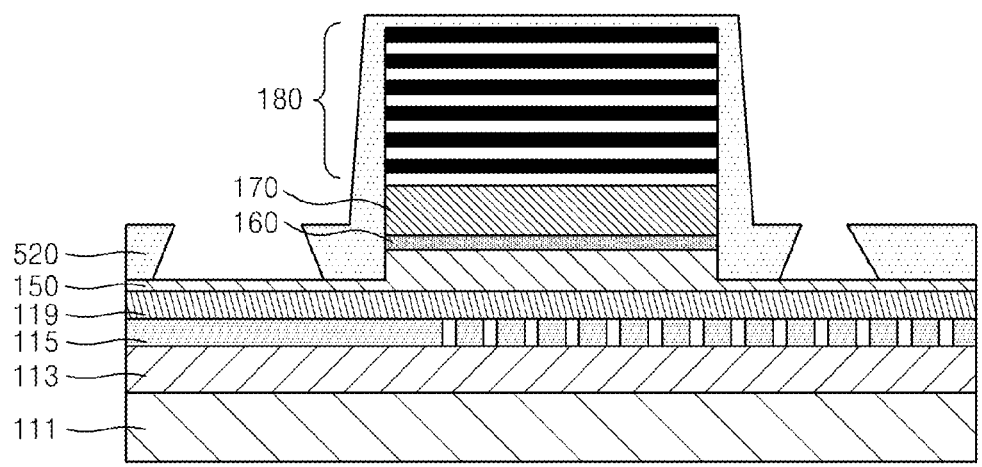

As shown in FIG. 7J, the photoresist layer 520 is patterned to have a pattern corresponding to a shape of the first electrode 140.

Figure 7K:
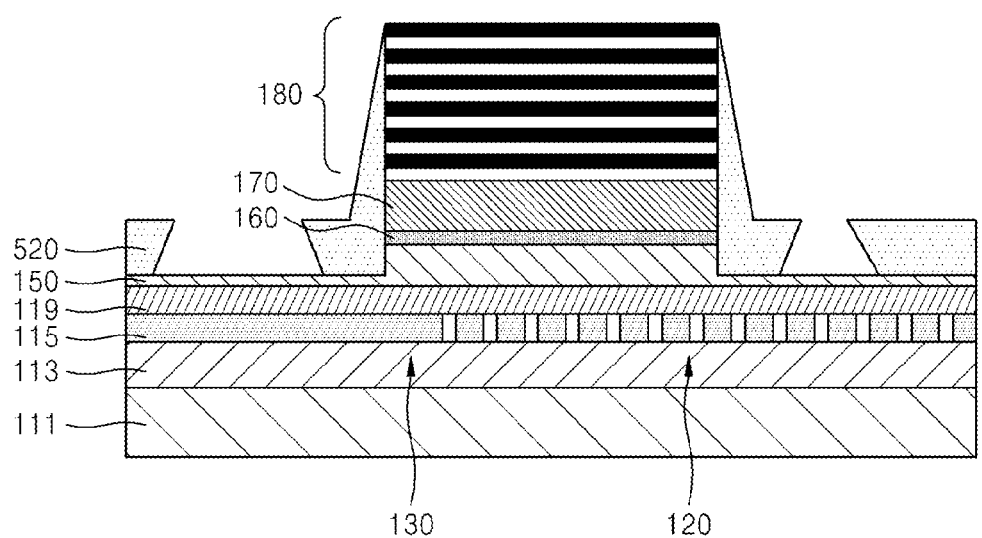
Figure 7L:
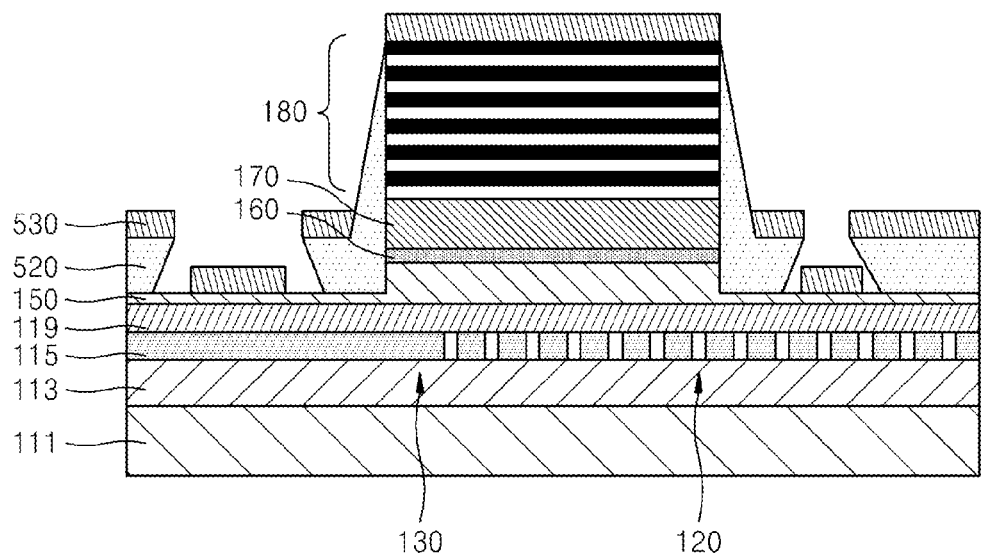

As shown in FIG. 7K, by using a plasma process, a portion of the photoresist layer 520 on the upper reflective layer 180 is removed. In this case, a reactive ion etching (RIE) plasma process using oxygen $O_2$ and argon (Ar) may be used.

Figure 7M:
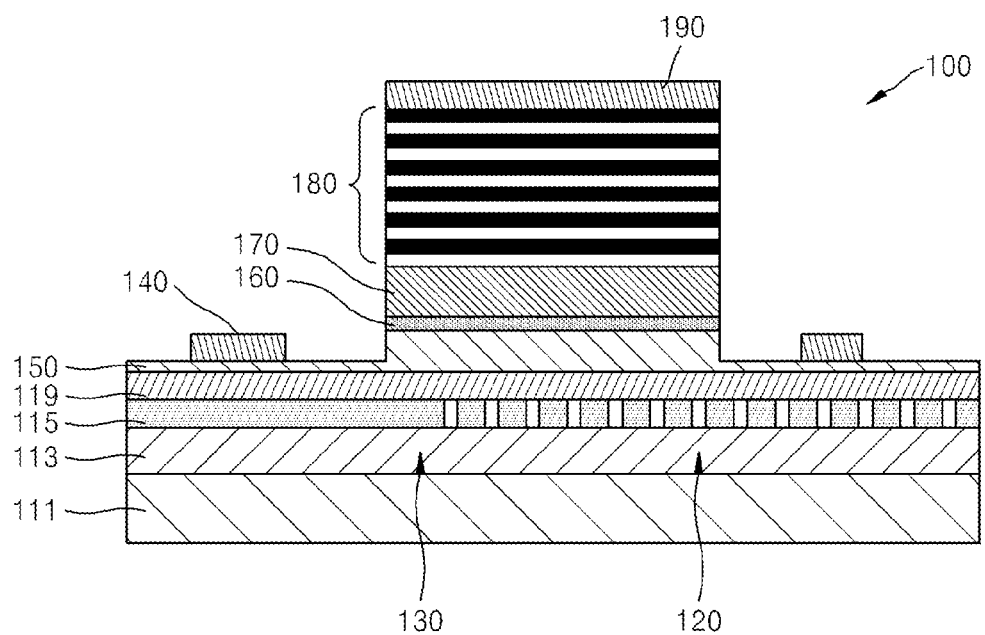

As shown in FIG. 7I, a metal material 530 is deposited on the whole surface of the structure of FIG. 7K and a lifting off process is performed. In this process, the metal material 530 on the photoresist layer 520 is also removed together with the photoresist layer 520, and only metal materials corresponding to the first electrode 140 and the second electrode 190 remains. Thus, a hybrid vertical cavity laser 100 as shown in FIG. 7M is formed.

In the above-described manufacturing method, since the process of aligning the metal structure (MS) with the waveguide 130 corresponds to a single step of FIG. 7F, the number of difficult processes to align an aperture of the mesa structure MS with the waveguide 130 decreases. In addition, when forming the first electrode 140 and the second electrode 190, it is possible to relatively easily form an electrode structure having a good pattern quality by a single metal composition and a lifting off process.

The hybrid vertical cavity laser may properly overlap the optical waveguide with the mesa aperture to increase the optical coupling efficiency.

According to the method of manufacturing the hybrid vertical cavity laser, it is possible to minimize the number of metal deposition and metal lifting off processes and simplify the manufacturing steps, and in addition, it is easy to align the optical waveguide with the mesa aperture in a desired shape.

While the inventive concepts have been particularly shown and described with reference to example embodiments thereof, it will be understood by those of ordinary skill in the art that various changes in form and details may be made therein without departing from the spirit and scope of the following claims.

What is claimed is:
1. A hybrid vertical cavity laser comprising:
    an optical circuit substrate including,
        a grating including lower refractive index units and a
            higher refractive index unit alternately arranged in a first direction, the lower refractive index units having a lower refractive index than the higher refractive index unit, and a waveguide guiding light in the first direction;

a mesa structure on the optical circuit substrate, the mesa structure including a first-type semiconductor layer, an active layer, a second-type semiconductor layer, and an upper reflective layer sequentially stacked in a second direction perpendicular to the first direction, the first-type semiconductor layer including an exposed portion;

a first electrode on the exposed portion of the first-type semiconductor layer; and a second electrode on the upper reflective layer, wherein an overlapped length between the waveguide and a mesa aperture forming an opening through which light produced from the active layer enters the grating is D, a pitch of the grating is p, and $0<D<p$.

2. The hybrid vertical cavity laser of claim 1, wherein the optical circuit substrate comprises:

a first layer;

a second layer on the first layer, the second layer including a material having a refractive index higher than that of the first layer and patterned to form the grating and the waveguide; and a dielectric material layer on the second layer, the dielectric material layer including a material having a refractive index lower than that of the second layer.

3. The hybrid vertical cavity laser of claim 2, wherein the first layer is formed of silicon oxide, and the second layer is formed of silicon.

4. The hybrid vertical cavity laser of claim 2, wherein the optical circuit substrate includes a silicon on insulator (SOI) substrate, the SOI substrate including a first silicon layer, a silicon oxide layer, and a second silicon layer, the silicon oxide layer is the first layer, and the second silicon layer is patterned to form the second layer.

5. The hybrid vertical cavity laser of claim 1, wherein the higher refractive index unit includes silicon, and the lower refractive index units include air.

6. The hybrid vertical cavity laser of claim 1, wherein a width of lower refractive index units and an interval between neighboring lower refractive index units are constant.

7. The hybrid vertical cavity laser of claim 1, wherein the lower refractive index units include a first lower refractive index unit and a second lower refractive index unit, the first lower refractive index unit and the second lower refractive index unit having different widths, the first lower refractive index unit and the second lower refractive index unit are alternately arranged, and the pitch p of the grating is defined as ½ of a pitch between neighboring first lower refractive index units.

8. The hybrid vertical cavity laser of claim 7, wherein an interval between neighboring first lower refractive index units and an interval between neighboring second lower refractive index units are constant.

9. The hybrid vertical cavity laser of claim 1, wherein an angle between a side of the mesa structure and the exposed portion of the first-type semiconductor layer is less than 90°.

\* \* \* \* \*